(12) United States Patent
Ohmi et al.

(10) Patent No.: US 9,385,042 B2
(45) Date of Patent: Jul. 5, 2016

(54) SEMICONDUCTOR DEVICE

(75) Inventors: Tadahiro Ohmi, Sendai (JP); Hiroaki Tanaka, Sendai (JP)

(73) Assignee: NATIONAL UNIVERSITY CORPORATION TOHOKU UNIVERSITY, Sendai-Shi, Miyagi-Ken (JP)

( * ) Notice: Subject to any disclaimer, the term of this patent is extended or adjusted under 35 U.S.C. 154(b) by 1155 days.

(21) Appl. No.: 13/079,431

(22) Filed: Apr. 4, 2011

(65) Prior Publication Data

US 2012/0187499 A1 Jul. 26, 2012

(30) Foreign Application Priority Data

Jan. 26, 2011 (JP) ................................. 2011-014366

(51) Int. Cl.
| | | |
|---|---|---|
| H01L 27/092 | (2006.01) | |
| H01L 21/8238 | (2006.01) | |
| H01L 21/8234 | (2006.01) | |
| H01L 21/84 | (2006.01) | |
| H01L 27/12 | (2006.01) | |

(52) U.S. Cl.
CPC ...... *H01L 21/823418* (2013.01); *H01L 21/823814* (2013.01); *H01L 21/84* (2013.01); *H01L 27/1203* (2013.01)

(58) Field of Classification Search
CPC .............. H01L 29/665; H01L 29/2839; H01L 21/8238
USPC .................. 257/350–351, 368–412
See application file for complete search history.

(56) References Cited

U.S. PATENT DOCUMENTS

| | | | | |
|---|---|---|---|---|
| 6,391,750 | B1* | 5/2002 | Chen et al. | 438/583 |
| 7,375,025 | B2* | 5/2008 | Lee et al. | 438/630 |
| 7,682,890 | B2* | 3/2010 | Hung et al. | 438/197 |
| 7,875,511 | B2* | 1/2011 | Yaocheng et al. | 257/350 |
| 2006/0038229 | A1 | 2/2006 | Tsuchiya et al. | |
| 2007/0145535 | A1* | 6/2007 | Ohmi et al. | 257/618 |
| 2009/0206413 | A1* | 8/2009 | Cabral et al. | 257/369 |

(Continued)

FOREIGN PATENT DOCUMENTS

| | | |
|---|---|---|
| JP | 2006-060045 A | 3/2006 |
| JP | 2009-267195 A | 11/2009 |

(Continued)

OTHER PUBLICATIONS

Hiroaki Tanaka et al., "Low Resistance Source/Drain Contacts With Low Schottky Barrier for High Performance Transistors", The Institute of Electronics, Information and Communication Engineers, IEICE Technical Report, Silicon Devices and Materials, Oct. 21-22, 2010, vol. 110, No. 241, 8 pages (with English Language Abstract).

(Continued)

*Primary Examiner* — Cuong Q Nguyen
(74) *Attorney, Agent, or Firm* — Buchanan Ingersoll & Rooney PC

(57) ABSTRACT

This invention provides a technique advantageous to improve the operating speed of an integrated circuit. In a semiconductor device in which an n-type transistor and a p-type transistor are formed on the (551) plane of silicon, the thickness of a silicide layer which is in contact with a diffusion region of the n-type transistor is smaller than that of a silicide layer which is in contact with a diffusion region of the p-type transistor.

16 Claims, 6 Drawing Sheets

(56) References Cited

U.S. PATENT DOCUMENTS

2009/0309164 A1* 12/2009 Chen et al. .................. 257/369
2010/0059830 A1 3/2010 Ohmi et al.

FOREIGN PATENT DOCUMENTS

WO WO2008/007748 A1 1/2008
WO 2009/133762 A1 11/2009

OTHER PUBLICATIONS

Japanese Office Action issued on Jul. 25, 2014, by the Japanese Patent Office in corresponding Japanese Patent Application No. 2011-014366. (3 pages).

* cited by examiner

SEMICONDUCTOR DEVICE

BACKGROUND OF THE INVENTION

1. Field of the Invention

The present invention relates to a semiconductor device in which a transistor is formed on the (551) plane of silicon.

2. Description of the Related Art

In the current integrated circuit formed from a CMOS transistor, the resistive component of the source/drain contact of the transistor hampers an improvement in characteristic of the integrated circuit. The effective transconductance $g_{meff}$ in a case that the source and drain electrodes have a series resistance $R_S$ is given as a function of the intrinsic transconductance $g_{mi}$ that represents the current driving capability of the transistor when it has no resistive component:

$$g_{meff} = \frac{g_{mi}}{1 + R_S g_{mi}} \quad (1)$$

As the series resistance $R_S$ rises, the effective transconductance $g_{meff}$ can be increased only slightly even by increasing the intrinsic transconductance $g_{mi}$, so the operating speed of the integrated circuit does not improve. It is of prime importance to thoroughly decrease the series resistance $R_S$ in an ultraminiaturized transistor which has a relatively high intrinsic transconductance $g_{mi}$. The series resistance $R_S$ of the source and drain electrodes of the transistor includes the contact resistance $R_C$ between the n$^+$ or p$^+$ region and the metal electrodes in the source and drain regions. If the source and drain regions have high impurity concentrations, the contact resistance $R_C$ is given by:

$$R_C \propto \exp\left[\frac{4\sqrt{m_p \varepsilon_S}}{h/(2\pi)}\left(\frac{\phi_b}{\sqrt{N_A}}\right)\right] \quad (2)$$

where h is Planck's constant, $m_p$ is the effective mass of electrons or holes, $\varepsilon_s$ is the dielectric constant of silicon, $N_A$ is the electron density or hole density in the n$^+$ or p$^+$ region, and $\phi_b$ is the barrier height between the metal electrodes (silicide) and the n$^+$ or p$^+$ region. To decrease the contact resistance, it is necessary to increase the carrier density $N_A$ at the contact interface and lower the barrier height $\phi_b$ between the metal electrodes (silicide) and the silicon.

A transistor formed on the (551) plane of silicon is advantageous to increase the intrinsic transconductance $g_{mi}$. However, it is difficult to form a silicide layer with characteristics that are good for both the (551) plane of the p-type region and that in the n-type region. A silicide layer formed on the (551) plane of the p-type region becomes an uneven film instead of a uniform film unless it has a certain thickness. On the other hand, if a silicide layer formed on the (551) plane of the n-type region has the same thickness as that formed on the (551) plane of the p-type region, its barrier height is so high that the contact resistance $R_C$ or the series resistance $R_S$ increases, thus hampering an improvement in operating speed of an integrated circuit.

SUMMARY OF THE INVENTION

The present invention has been made in consideration of the above-mentioned problem recognition, and has as its object to provide a technique advantageous to improve the operating speed of an integrated circuit.

According to the first aspect of the present invention, there is provided a semiconductor device in which an n-type transistor and a p-type transistor are formed on a (551) plane of silicon, wherein a thickness of a silicide layer which is in contact with a diffusion region of the n-type transistor is smaller than a thickness of a silicide layer which is in contact with a diffusion region of the p-type transistor.

According to the second aspect of the present invention, there is provided a semiconductor device in which an n-type transistor is formed on a (551) plane of silicon, wherein a thickness of a silicide layer which is in contact with a diffusion region of the n-type transistor is not less than 2 nm and is not more than 8.5 nm.

Further features of the present invention will become apparent from the following description of exemplary embodiments with reference to the attached drawings.

DESCRIPTION OF THE EMBODIMENTS

A silicide layer formed on the (100) plane of silicon in an n-type region is preferably made of erbium (Er) silicide or holmium (Ho) silicide. A silicide layer formed on the (100) plane of silicon in a p-type region is preferably made of palladium (Pd) silicide. Erbium silicide, holmium silicide, and palladium silicide can attain contact with a barrier height as low as about 0.3 eV.

Nevertheless, special attention must be paid to silicide layers which are formed on the (551) plane of silicon for contact. It was found that a silicide layer formed on the (551) plane of silicon in an n-type region, such as an erbium silicide layer and a holmium silicide layer, is likely to have a barrier height higher than a palladium silicide layer formed on the (551) plane of silicon in a p-type region. Also, a silicide layer formed on the (551) plane of silicon in a p-type region, such as a palladium silicide layer, becomes an uneven film instead of a uniform film unless it has a certain thickness.

The inventor of this invention surmised that the foregoing difference in barrier height between the (100) and (551) planes of the silicon occurs because silicon atoms have a lowest surface density of $6.8 \times 10^{14}$ cm$^{-2}$ on the (100) plane of the silicon, whereas silicon atoms have a highest surface density of $9.7 \times 10^{14}$ cm$^{-2}$ on the (551) plane of the silicon. Silicon (Si), palladium (Pd), erbium (Er), and holmium (Ho) have atomic radii of 0.117 nm, 0.13 nm, 0.175 nm, and 0.174 nm, respectively, so erbium and holmium have extremely large atomic radii. A very high stress is produced when erbium or holmium forms a silicide on the (551) plane of silicon with a high atomic surface density. The inventor of this invention therefore surmised that the silicide formed on the (551) plane has a high barrier height due to such a stress.

Figure 1A:
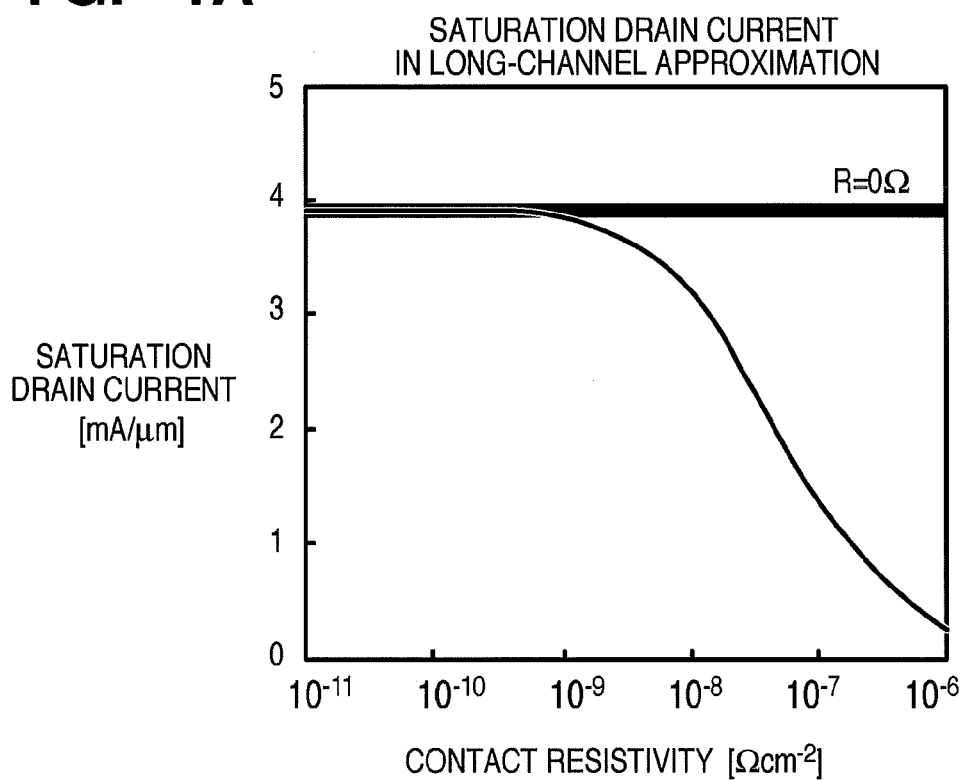
FIG. 1A is a graph showing the contact resistivity dependence of the current driving capability (saturation drain current), per channel width of 1 μm, of a transistor with a channel length of 45 nm
Figure 1B:
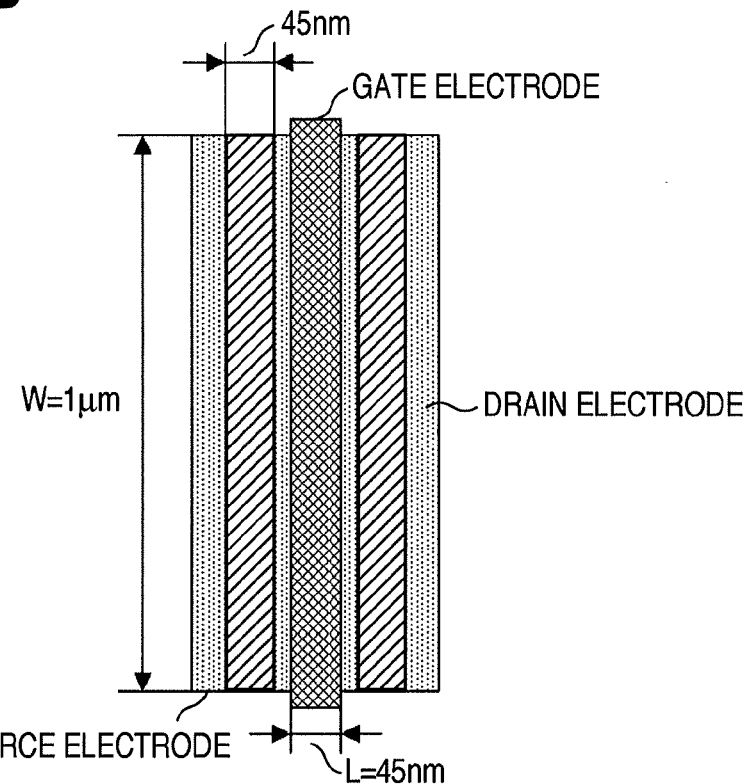
FIG. 1B is a plan view showing the transistor.

FIG. 1A shows the contact resistivity dependence of the current driving capability (saturation drain current), per channel width of 1 µm, of a transistor with a channel length of 45 nm. FIG. 1B is a plan view showing the schematic arrangement of this transistor. The contact width (the width in the same direction as the channel length direction) of the silicide layer between the source and drain electrodes is 45 nm, and the electron/hole density in the source/drain region is $2 \times 10^{20}$ cm$^{-3}$. As can be seen from FIG. 1A, when the contact resistivity exceeds $1 \times 10^{-9}$ Ω·cm$^2$, the current driving capability degrades accordingly. In view of this, this invention aims at adjusting the contact resistivity to $1 \times 10^{-9}$ Ω·cm$^2$ or less.

Figure 2:
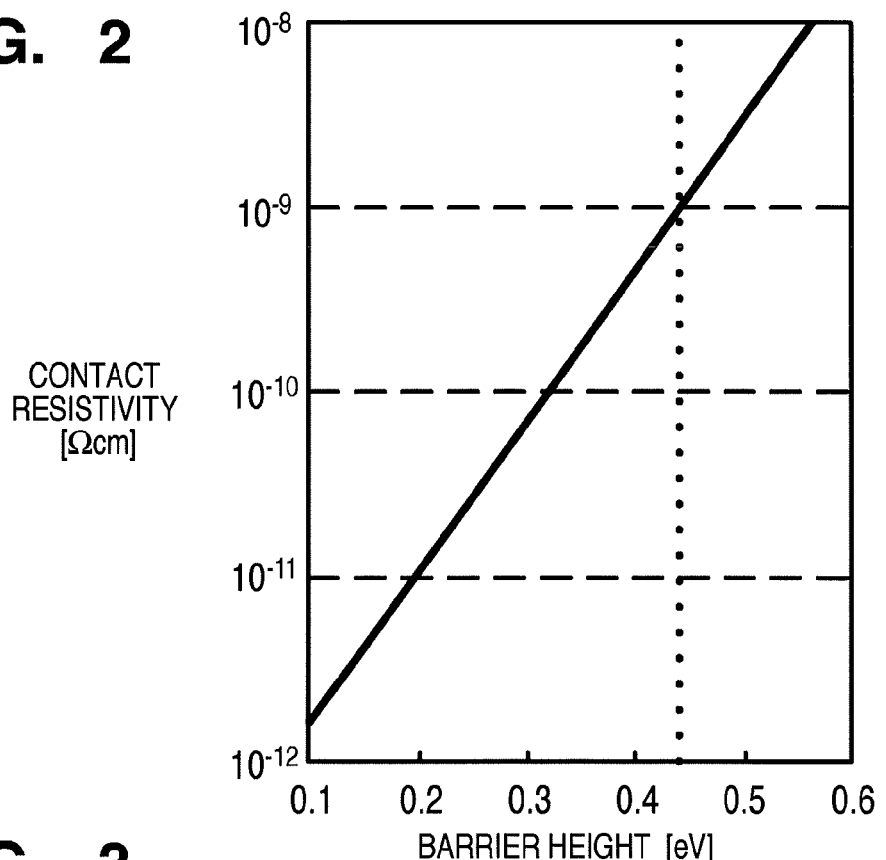
FIG. 2 is a graph showing the relationship between the contact resistivity and the barrier height.

FIG. 2 shows the barrier height required to attain a contact resistivity of $1 \times 10^{-8}$ Ω·cm$^2$ to $1 \times 10^{-11}$ Ω·cm$^2$. The electron/hole density is $2 \times 10^{20}$ cm$^{-3}$. To attain the target contact resistivity of $1 \times 10^{-9}$ Ω·cm$^2$, the barrier height must be 0.43 eV or less.

Figure 3:
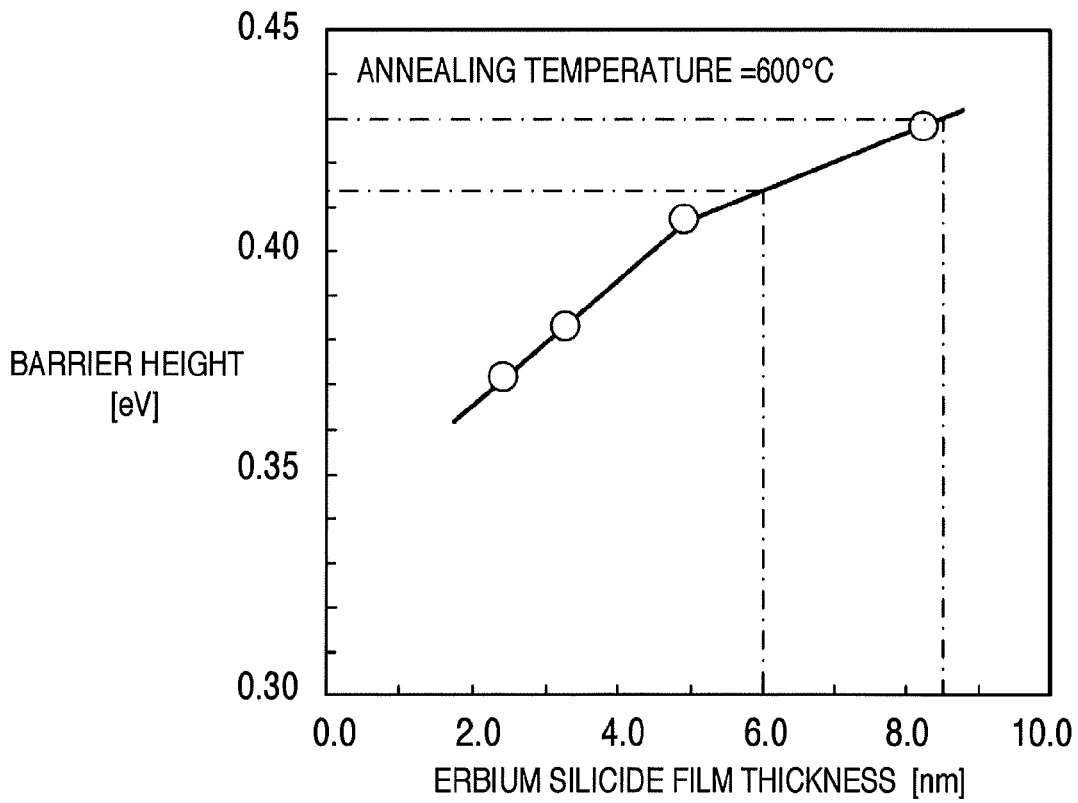
FIG. 3 is a graph showing the film thickness dependence of the barrier height of erbium silicide formed on the (551) plane of n-type silicon.

FIG. 3 shows the film thickness dependence of the barrier height (the barrier height for n-type silicon) of erbium silicide formed on the (551) plane of n-type silicon. The annealing temperature for siliciding erbium was 600° C. As the film thickness of the erbium silicide decreases, the barrier height lowers. When the film thickness of the erbium silicide reaches 2.5 nm, the barrier height becomes 0.37 eV. A barrier height of 0.43 eV or less required to attain the target contact resistivity of $1 \times 10^{-9}$ Ω·cm$^2$ is achieved by setting the film thickness of the erbium silicide to 8.5 nm or less. Nevertheless, the inventor of this invention surmised that it is impractical to form erbium silicide with a film thickness less than 2 nm, and verified by experiments that erbium silicide with a film thickness of 2.5 nm or more can be stably formed. Hence, the film thickness of erbium silicide formed on the (551) plane of silicon in an n-type region must be 2 nm (inclusive) to 8.5 nm (inclusive), is preferably 2.5 nm (inclusive) to 6 nm (inclusive), and is more preferably 2.5 nm (inclusive) to 4 nm (inclusive).

The same holds true when holmium silicide is formed on the (551) plane of n-type silicon using holmium with an atomic radius nearly equal to that of erbium instead of forming erbium silicide on it, so the film thickness of the holmium silicide must be 2 nm (inclusive) to 8.5 nm (inclusive), is preferably 2.5 nm (inclusive) to 6 nm (inclusive), and is more preferably 2.5 nm (inclusive) to 4 nm (inclusive).

Figures 4, 5:
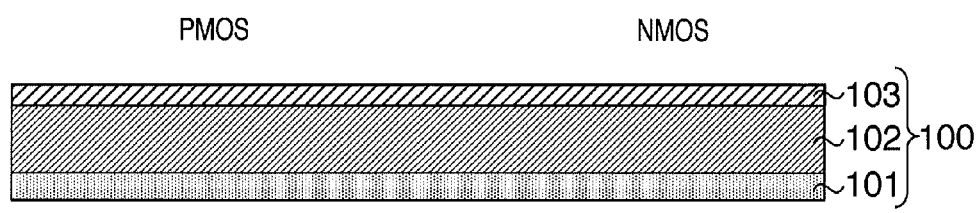
FIG. 4 is a view showing electron microscope (SEM) images of palladium silicide formed on the (551) plane of silicon in a p-type region.
FIG. 5 is a view for exemplifying a semiconductor device manufacturing method according to a preferred embodiment of the present invention.

FIG. 4 shows electron microscope (SEM) images of palladium silicide formed on the (551) plane of silicon in a p-type region. Referring to FIG. 4, "Annealing at 500° C." indicates that palladium silicide was formed by annealing palladium at 500° C. to silicide it. "Annealing at 600° C." indicates that palladium silicide was formed by annealing palladium at 600° C. to silicide it. Referring to FIG. 4 again, "5 nm", "10 nm", and "20 nm" indicate the film thicknesses of palladium before its silicidation. As can be seen from FIG. 4, palladium is satisfactorily silicided when it has a film thickness of 10 nm (Palladium Silicide Film Thickness=14 nm) or more in annealing at 500° C. and when it has a film thickness of 20 nm (Palladium Silicide Film Thickness=28 nm) or more in annealing at 600° C. Palladium silicide is likely to become uneven instead of uniform unless it has a certain film thickness. The barrier height for p-type silicon was 0.30 eV in annealing at 500° C. and 0.29 eV in annealing at 600° C. As one measure, the film thickness of the palladium silicide is preferably larger than that of a silicide layer which can be formed from, for example, erbium silicide or holmium silicide and is used for an n-type region, and is more preferably 10 nm or more.

Figure 18:
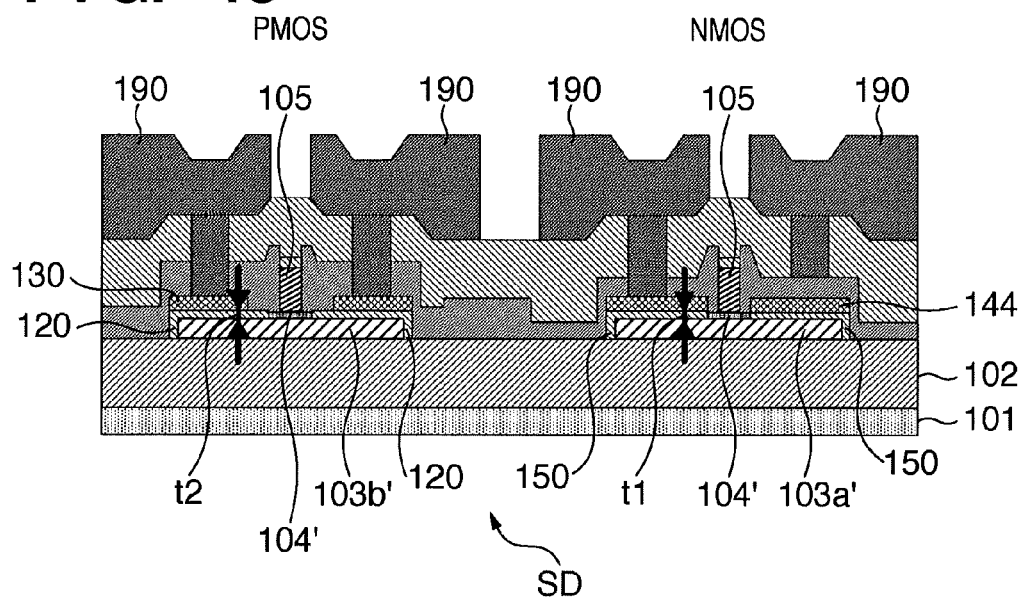
FIG. 18 is a view for exemplifying the semiconductor device manufacturing method according to the preferred embodiment of the present invention.

FIG. 18 is a sectional view schematically showing the arrangement of a semiconductor SD according to a preferred embodiment of the present invention. The semiconductor SD has an arrangement in which n- and p-type transistors are formed on the (551) plane of silicon. The expression that a transistor is formed on the (551) plane means that a certain element (for example, a gate oxide film) which constitutes the transistor is formed on the (551) plane. The n-type transistor can typically be an NMOS transistor, and the p-type transistor can typically be a PMOS transistor. The arrangement shown in FIG. 18 can also be interpreted as the basic arrangement of a CMOS circuit. Although a typical example in which the n-type transistor is an NMOS transistor, and the p-type transistor is a PMOS transistor will be described hereinafter, this is not intended to limit the present invention to this arrangement.

The NMOS transistor includes, for example, a diffusion region 103a', silicide layers 150, metal electrodes 144, a gate insulating film 104', and a gate electrode 105. The diffusion region 103a' includes source and drain regions. The silicide layers 150 are in contact with the source and drain regions of the diffusion region 103a'. The metal electrodes 144 are in contact with the upper surfaces of the silicide layers 150. The silicide layer 150 and metal electrode 144 form a contact portion with the diffusion region 103a'. The PMOS transistor includes, for example, a diffusion region 103b', silicide layers 120, metal electrodes 130, a gate insulating film 104', and a gate electrode 105. The diffusion region 103b' includes source and drain regions. The silicide layers 120 are in contact with the source and drain regions of the diffusion region 103b'. The metal electrodes 130 are in contact with the upper surfaces of the silicide layers 120. The silicide layer 120 and metal electrode 130 form a contact portion with the diffusion region 103b'. The diffusion regions 103a' and 103b' may be formed on an insulator 102, as illustrated in FIG. 18, or may be formed within a semiconductor region (for example, a semiconductor substrate, an epitaxial layer, or wells).

A thickness t1 of the silicide layers 150 of the NMOS transistor can be 2 nm (inclusive) to 8.5 nm (inclusive). The thickness t1 of the silicide layers 150 is preferably 2.5 nm (inclusive) to 6 nm (inclusive), and is more preferably 2.5 nm (inclusive) to 4 nm (inclusive). The silicide layers 150 can be formed from, for example, erbium silicide or holmium silicide.

The thickness t1 of the silicide layers 150 of the NMOS transistor is preferably smaller than a thickness t2 of the silicide layers 120 of the PMOS transistor. The thickness t2 of the silicide layers 120 of the PMOS transistor can be, for example, 10 nm or more.

A method of manufacturing a semiconductor SD according to a preferred embodiment of the present invention will be exemplified below with reference to FIGS. 5 to 18. Referring to FIGS. 5 to 18, "NMOS" indicates a region in which an NMOS transistor is to be formed or a finished NMOS transistor, and "PMOS" indicates a region in which a PMOS transistor is to be formed or a finished PMOS transistor.

First, in a process shown in FIG. 5, an SOI (Silicon On Insulator) substrate 100 is prepared. The SOI substrate 100 has an insulator 102 on a silicon region 101, and an SOI layer (silicon region) 103 on the insulator 102. The surface of the SOI layer 103 coincides with the (551) plane.

Figure 6:
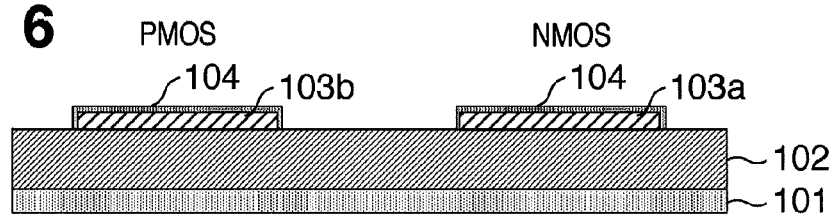
FIG. 6 is a view for exemplifying the semiconductor device manufacturing method according to the preferred embodiment of the present invention.

Next, in a process shown in FIG. 6, boron ions are implanted into a region, in which an NMOS transistor is to be formed, in the SOI layer 103, and antimony ions are implanted into a region, in which a PMOS transistor is to be formed, in the SOI layer 103, and thereafter activation annealing is performed. Thus, a p-well 103a is formed in the region in which an NMOS transistor is to be formed, and an n-well 103b is formed in the region in which a PMOS transistor is to be formed. The SOI layer 103 is patterned by dry etching such as microwave plasma dry etching. The surfaces of the p-well 103a and n-well 103b are oxidized by an oxidation method such as radical oxidation to form silicon oxide films 104 used to form gate insulating films 104'. The silicon oxide films 104 can have a thickness of, for example, 3 nm.

Figure 7:
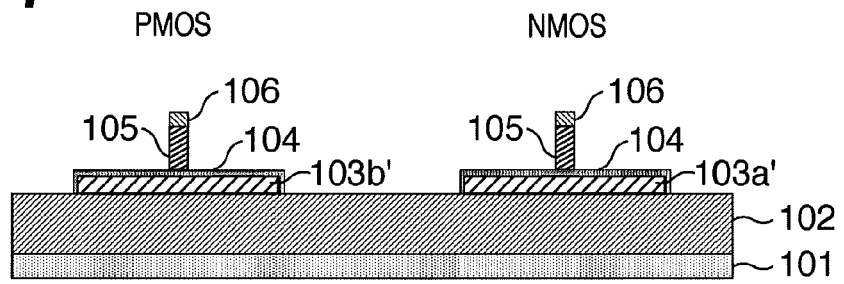
FIG. 7 is a view for exemplifying the semiconductor device manufacturing method according to the preferred embodiment of the present invention.

In a process shown in FIG. 7, non-doped polysilicon films used to form gate electrodes 105 are formed by a deposition method such as LPCVD (Low Pressure Chemical Vapor Deposition). The polysilicon films can have a thickness of, for example, 150 nm. Oxide films are formed by a deposition method such as APCVD (Atmospheric Pressure Chemical Vapor Deposition) and patterned to form hard masks 106. The oxide films or the hard masks 106 can have a thickness of, for example, 100 nm. The polysilicon films are etched by dry etching such as microwave plasma dry etching to form gate electrodes 105. Arsenic ions are implanted into the p-well 103a in which an NMOS transistor is to be formed, and boron ions are implanted into the n-well 103b in which a PMOS transistor is to be formed, and thereafter activation annealing is performed to form source and drain regions in each of the p-well 103a and n-well 103b. For the sake of convenience, the p-well 103a in which the source and drain regions are formed will be referred to as a diffusion region 103a' hereinafter, and the n-well 103b in which the source and drain regions are formed will be referred to as a diffusion region 103b' hereinafter.

Figure 8:
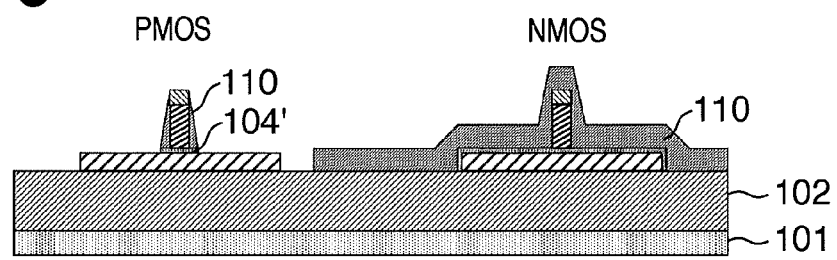
FIG. 8 is a view for exemplifying the semiconductor device manufacturing method according to the preferred embodiment of the present invention.

In a process shown in FIG. 8, a silicon nitride film 110 is formed by a deposition method such as ME-PECVD (Microwave Excited Plasma Enhanced Chemical Vapor Deposition). The silicon nitride film 110 can have a thickness of, for example, 20 nm. The silicon nitride film 110 is removed by dry etching such as microwave plasma dry etching only in the region in which a PMOS transistor is to be formed. Further, the silicon oxide film 104 on the source and drain regions in the region in which a PMOS transistor is to be formed is removed using a diluted hydrofluoric acid (HF) solution.

Figure 9:
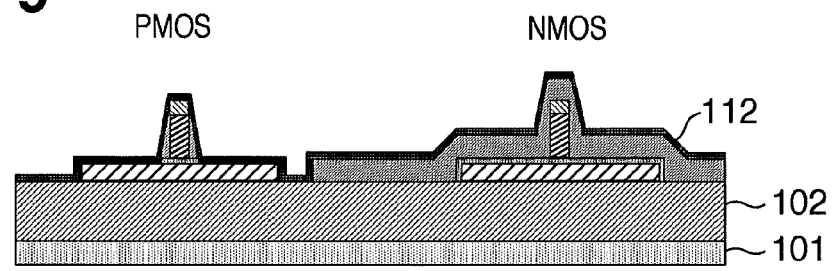
FIG. 9 is a view for exemplifying the semiconductor device manufacturing method according to the preferred embodiment of the present invention.

In a process shown in FIG. 9, a palladium film 112 is formed by sputtering. The palladium film 112 can have a thickness of, for example, 7.5 nm.

Figure 10:
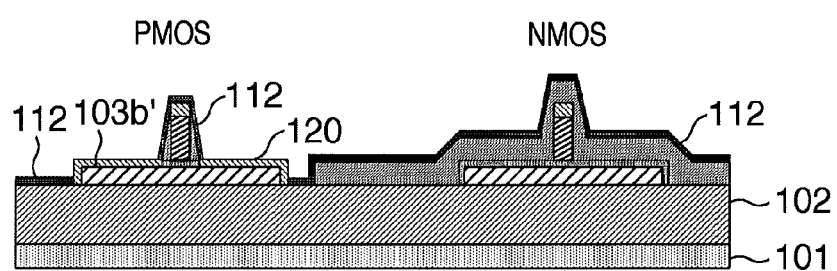
FIG. 10 is a view for exemplifying the semiconductor device manufacturing method according to the preferred embodiment of the present invention.

In a process shown in FIG. 10, silicidation annealing is performed to react the palladium film 112 and the silicon in the diffusion region 103b' with each other, thereby forming palladium silicide layers 120. The palladium silicide layers 120 can have a thickness of, for example, 11 nm. In this silicidation annealing, no reaction occurs on either the silicon oxide film or the silicon nitride film, and only the source and drain regions of the PMOS transistor are silicided.

Figure 11:
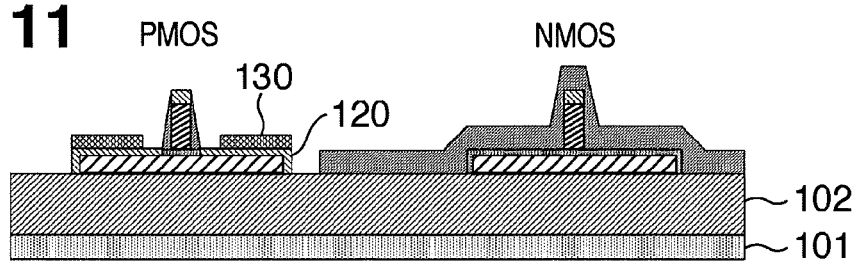
FIG. 11 is a view for exemplifying the semiconductor device manufacturing method according to the preferred embodiment of the present invention.

In a process shown in FIG. 11, a tungsten film (metal film) is formed to have a thickness of, for example, 100 nm by sputtering. The tungsten film is wet-etched while leaving portions in the source and drain regions of the PMOS transistor intact. Any unreacted palladium film 112 is removed by wet etching. Thus, the tungsten film is patterned, thereby forming metal electrodes (tungsten electrodes) 130 in contact with the palladium silicide layers 120. At this time, the tungsten film can be etched up to a thickness of, for example, about 50 nm.

Figure 12:
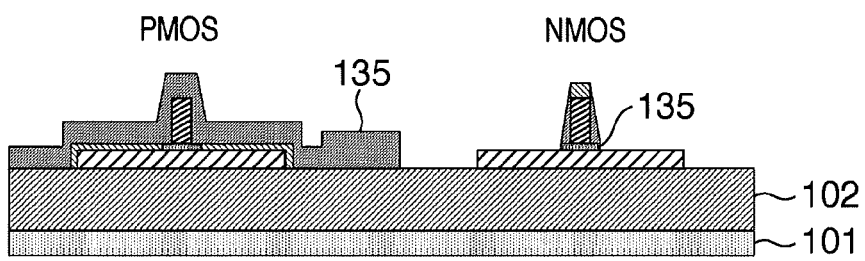
FIG. 12 is a view for exemplifying the semiconductor device manufacturing method according to the preferred embodiment of the present invention.

In a process shown in FIG. 12, a silicon nitride film 135 is formed by a deposition method such as ME-PECVD (Microwave Excited Plasma Enhanced Chemical Vapor Deposition). The silicon nitride film 135 can have a thickness of, for example, 20 nm. The silicon nitride film 135 is removed by dry etching such as microwave plasma dry etching only in the region in which an NMOS transistor is to be formed. Further, the silicon oxide film 104 on the source and drain regions in the region in which an NMOS transistor is to be formed is removed using a diluted hydrofluoric acid (HF) solution.

Figure 13:
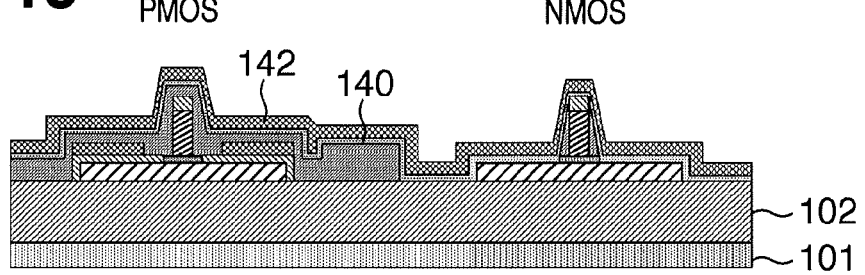
FIG. 13 is a view for exemplifying the semiconductor device manufacturing method according to the preferred embodiment of the present invention.

In a process shown in FIG. 13, an erbium film 140 and a tungsten film (metal film) 142 are sequentially formed by sputtering. The erbium film 140 can have a thickness of, for example, 2 nm. The tungsten film 142 can have a thickness of, for example, 100 nm.

Figure 14:
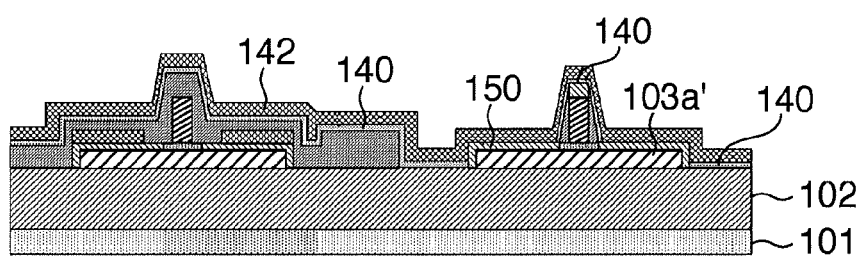
FIG. 14 is a view for exemplifying the semiconductor device manufacturing method according to the preferred embodiment of the present invention.

In a process shown in FIG. 14, silicidation annealing is performed to react the erbium film 140 and the silicon in the diffusion region 103a' with each other, thereby forming erbium silicide layers 150. The erbium silicide layers 150 can have a thickness of, for example, 3.3 nm. In this silicidation annealing, no reaction occurs on either the silicon oxide film or the silicon nitride film, and only the source and drain regions of the NMOS transistor are silicided. As described above, silicidation layers with different materials and film thicknesses are formed in the source and drain regions of the PMOS and NMOS transistors, respectively.

Figure 15:
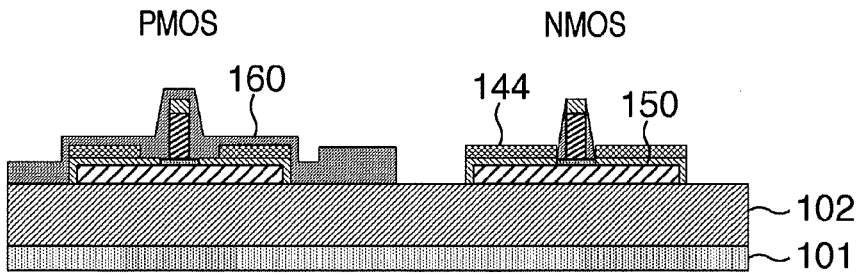
FIG. 15 is a view for exemplifying the semiconductor device manufacturing method according to the preferred embodiment of the present invention.

In a process shown in FIG. 15, the tungsten film 142 and any unreacted erbium film 140 are removed by wet etching while leaving portions in the source and drain regions of the NMOS transistor intact. Thus, metal electrodes (tungsten electrodes) 144 are formed on the source and drain regions of the NMOS transistor in contact with the erbium silicide layers 150.

Figure 16:
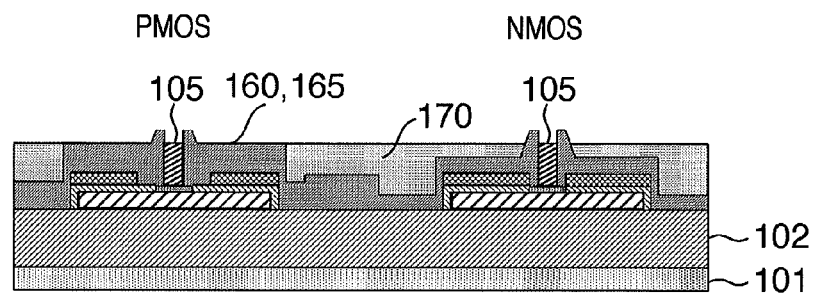
FIG. 16 is a view for exemplifying the semiconductor device manufacturing method according to the preferred embodiment of the present invention.

In a process shown in FIG. 16, a silicon nitride film 165 is deposited to have a thickness of, for example, 20 nm, and an oxide film 170 used for planarization is deposited to have a thickness of, for example, 400 nm, both by a deposition method such as ME-PECVD (Microwave Excited Plasma Enhanced Chemical Vapor Deposition). Both the oxide film 170 and the hard mask (oxide film) 106 are etched by dry etching such as microwave plasma dry etching to expose the upper surface of the gate electrodes 105.

Figure 17:
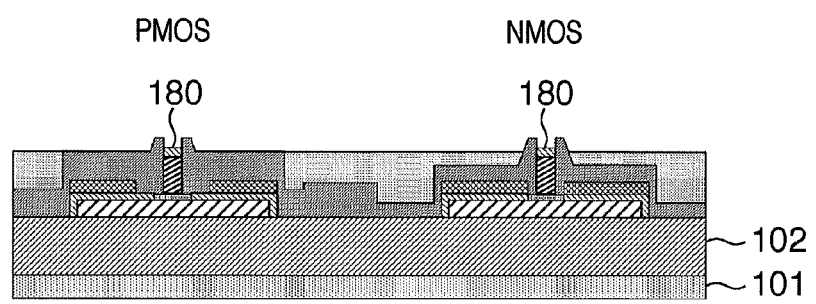
FIG. 17 is a view for exemplifying the semiconductor device manufacturing method according to the preferred embodiment of the present invention.

In a process shown in FIG. 17, a palladium film is deposited to have a thickness of, for example, 10 nm by sputtering, and silicidation annealing is performed to silicide the palladium film. At this time, no silicidation reaction occurs on all of the silicon oxide film, the planarizing oxide film, and the silicon nitride film, and a silicidation reaction occurs only on the palladium film on the gate electrodes 105 to form palladium silicide layers 180. Any unreacted palladium film is removed by wet etching.

Lastly, in a process shown in FIG. 18, a silicon oxide film with a thickness of, for example, 300 nm is formed as an interlayer dielectric film using APCVD (Atmospheric Pressure Chemical Vapor Deposition), and contact holes are formed by dry etching such as microwave plasma dry etching. Aluminum is deposited by a deposition method such as vapor deposition or sputtering, and patterned by dry etching such as microwave plasma dry etching, thereby forming electrodes. With the foregoing processes, an arrangement schematically shown in FIG. 18 is obtained. After that, a semiconductor device is completed upon, for example, a normal interconnection process.

In this specification and the following scope of claims, the (551) plane does not mean a physically strict (551) plane alone and includes a plane which makes an offset angle of 4° or less with the physically strict (551) plane. Note that the applicant of this invention may limit the definition of the (551) plane to a plane which makes an offset angle less than an arbitrary angle of, for example, 3°, 2°, 1°, or 0.5° with the physically strict (551) plane after filing this application in order to differentiate this invention from prior arts which are unknown to the applicant at the current moment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-014366, filed Jan. 26, 2011, which is hereby incorporated by reference herein in its entirety.

What is claimed is:

1. A semiconductor device comprising a complementary metal-oxide semiconductor (CMOS) circuit formed on a (551) plane of silicon, wherein
the CMOS circuit includes an n-type transistor and a p-type transistor,
each of the n-type transistor and the p-type transistor includes a diffusion region and a silicide layer, said silicide layer of each of the n-type transistor and the p-type transistor (i) being in contact with the diffusion region and (ii) consisting of silicon and a metal material,
a thickness of the silicide layer, which is in contact with the diffusion region of the n-type transistor, is not less than 2 nm and is not more than 8.5 nm, and
a thickness of the silicide layer, which is in contact with the diffusion region of the p-type transistor, is thicker than the thickness of the silicide layer of the n-type transistor.

2. The device according to claim 1, wherein the thickness of the silicide layer which is in contact with the diffusion region of the n-type transistor is not less than 2.5 nm and is not more than 6 nm.

3. The device according to claim 1, wherein the thickness of the silicide layer which is in contact with the diffusion region of the n-type transistor is not less than 2.5 nm and is not more than 4 nm.

4. The device according to claim 1, wherein the silicide layer which is in contact with the diffusion region of the n-type transistor is made of a material selected from the group consisting of erbium silicide and holmium silicide.

5. The device according to claim 1, wherein the silicide layer which is in contact with the diffusion region of the p-type transistor is made of palladium silicide.

6. A semiconductor device comprising a complementary metal-oxide semiconductor (CMOS) circuit formed on a (551) plane of silicon, wherein
the CMOS circuit includes an n-type transistor,
the n-type transistor includes a diffusion region and a silicide layer, said silicide layer (i) being in contact with said diffusion region and (ii) consisting of silicon and a metal material, and
a thickness of the silicide layer which is in contact with the diffusion region of the n-type transistor is not less than 2 nm and is not more than 8.5 nm.

7. The device according to claim 6, wherein the thickness of the silicide layer is not less than 2.5 nm and is not more than 6 nm.

8. The device according to claim 6, wherein the thickness of the silicide layer is not less than 2.5 nm and is not more than 4 nm.

9. The device according to claim 6, wherein the silicide layer which is in contact with the diffusion region of the n-type transistor is made of a material selected from the group consisting of erbium silicide and holmium silicide.

10. A semiconductor device comprising a complementary metal-oxide semiconductor (CMOS) circuit formed on a (551) plane of silicon, wherein
the CMOS circuit includes an n-type transistor and a p-type transistor,
each of the n-type transistor and the p-type transistor includes a diffusion region and a silicide layer, said silicide layer of each of the n-type transistor and the p-type transistor (i) being in contact with the diffusion region and (ii) consisting of silicon and a metal material,
the material of the silicide layer that is in contact with the diffusion region of the n-type transistor is different from the material of the silicide layer that is in contact with the diffusion region of the p-type transistor, and
a thickness of the silicide layer that is in contact with the diffusion region of the n-type transistor is smaller than a thickness of the silicide layer that is in contact with a diffusion region of the p-type transistor.

11. The device according to claim 1, wherein the metal material of the silicide layer that is in contact with the diffusion region of the n-type transistor is different from the metal material of the silicide layer that is in contact with the diffusion region of the p-type transistor.

12. The device according to claim 1, wherein the thickness of the silicide layer, which is in contact with the diffusion region of the p-type transistor, is not less than 10 nm.

13. The device according to claim 1, wherein the thickness of the silicide layer, which is in contact with the diffusion region of the p-type transistor, is not less than 20 nm.

14. A semiconductor device comprising a complementary metal-oxide semiconductor (CMOS) circuit formed on a plane of silicon, wherein
the CMOS circuit includes an n-type transistor and a p-type transistor,
each of the n-type transistor and the p-type transistor includes a diffusion region and a silicide layer, said silicide layer of each of the n-type transistor and the p-type transistor (i) being in contact with the diffusion region and (ii) consisting of silicon and a metal material,
a thickness of the silicide layer, which is in contact with the diffusion region of the n-type transistor, is not less than 2 nm and is not more than 8.5 nm, and
a thickness of the silicide layer, which is in contact with the diffusion region of the p-type transistor, is thicker than the thickness of the silicide layer of the n-type transistor.

15. A semiconductor device comprising a complementary metal-oxide semiconductor (CMOS) circuit formed on a plane of silicon, wherein
the CMOS circuit includes an n-type transistor,
the n-type transistor includes a diffusion region and a silicide layer, said silicide layer (i) being in contact with said diffusion region and (ii) consisting of silicon and a metal material, and
a thickness of the silicide layer which is in contact with the diffusion region of the n-type transistor is not less than 2 nm and is not more than 8.5 nm.

16. A semiconductor device comprising a complementary metal-oxide semiconductor (CMOS) circuit formed on a plane of silicon, wherein
CMOS circuit includes an n-type transistor and a p-type transistor
each of the n-type transistor and the p-type transistor includes a diffusion region and a silicide layer, said silicide layer of each of the n-type transistor and the p-type transistor (i) being in contact with the diffusion region and (ii) consisting of silicon and a metal material,
the material of the silicide layer that is in contact with the diffusion region of the n-type transistor is different from the material of the silicide layer that is in contact with the diffusion region of the p-type transistor, and
a thickness of the silicide layer that is in contact with the diffusion region of the n-type transistor is smaller than a thickness of the silicide layer that is in contact with a diffusion region of the p-type transistor.

* * * * *